(12) United States Patent
Lin et al.

(10) Patent No.: US 11,737,348 B2
(45) Date of Patent: Aug. 22, 2023

(54) HALIDE MATERIAL AND OPTICAL UNIT AND OPTOELECTRONIC DEVICE HAVING THE SAME

(71) Applicant: National Tsing Hua University, Hsinchu (TW)

(72) Inventors: Hao-Wu Lin, Hsinchu (TW); Ho-Hsiu Chou, Hsinchu (TW); Chih-Li Chang, Hsinchu (TW); Chien-Yu Chen, Hsinchu (TW); Lin Yang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 17/384,884

(22) Filed: Jul. 26, 2021

(65) Prior Publication Data

US 2022/0302393 A1   Sep. 22, 2022

(30) Foreign Application Priority Data

Mar. 10, 2021 (TW) .................................. 110108452

(51) Int. Cl.
| | |
|---|---|
| *C09K 11/06* | (2006.01) |
| *H10K 85/30* | (2023.01) |
| *C07F 7/24* | (2006.01) |
| *H01S 3/16* | (2006.01) |
| *H10K 50/135* | (2023.01) |

(52) U.S. Cl.
CPC ............... *H10K 85/30* (2023.02); *C07F 7/24* (2013.01); *C09K 11/06* (2013.01); *C09K 2211/1007* (2013.01); *H01S 3/1675* (2013.01); *H10K 50/135* (2023.02)

(58) Field of Classification Search
CPC ...... C07F 7/24; C07F 9/94; C07F 7/28; C07F 7/30; H01L 21/02197; H01L 45/147; H01L 28/55; Y10S 502/525; C01P 2002/34; B01J 23/002; G11C 2213/31
See application file for complete search history.

(56) References Cited

U.S. PATENT DOCUMENTS

2007/0117848 A1 *  5/2007  Puerta ....................... A61P 9/10
                                                            514/346
2020/0189927 A1 *  6/2020  Whitaker ................ C03C 17/36

FOREIGN PATENT DOCUMENTS

WO   WO-2011163610 A2 * 12/2011   ........... A61K 9/0019
WO   WO-2020257549 A2 * 12/2020   ........... A61K 31/137

OTHER PUBLICATIONS

CAS Abstract RN = 2361675-41-2 (Jul. 28, 2019) (Year: 2019).*
J. March, Advanced Organic Chemistry Reactions, Mechanisms and Structure 248-272 (4th ed., 1992) (Year: 1992).*
H. Bohme et al., Iminium Salts in Organic Chemistry, Part 1, 108-109 (John Wiley & Sons 1976) (Year: 1976).*
C. Went, Work Out Organic Chemistry, 192-209 (1988) (Year: 1988).*
Wikipedia, Carbon-nitrogen bond (2019) (downloaded Feb. 6, 2023) from https://en.wikipedia.org/w/index.php?title=Carbon%E2%80%93nitrogen_bond&oldid=918183399) (Year: 2019).*
I. Wallmann et al., 15 Synthesis, 2446-2450 (2008) (Year: 2008).*

* cited by examiner

*Primary Examiner* — Alexander R Pagano
(74) *Attorney, Agent, or Firm* — Anova Law Group, PLLC (57) ABSTRACT

A halide material having general formula ArMAX is disclosed. The halide material can be processed to an optoelectronic film with a halogenated formamidine and a lead halide, and the optoelectronic film can be applied in the manufacture of an optoelectronic device like a perovskite laser or a PeLED. Experimental data have proved that, the fabricated optoelectronic film shows a property of photoluminescence (PL) peak wavelength adjustable. Moreover, the PL peak wavelength moves from 482 nm to 534 nm with the increase of the content of lead (Pb), halogen (X) and formamidine (FA) in the optoelectronic film. Furthermore, experimental data have also indicated that, the fabricated optoelectronic film can be used as a blue emissive layer, a red emissive layer or a green emissive layer, thereby having a significant potential for application in optoelectronics industry.

8 Claims, 9 Drawing Sheets

HALIDE MATERIAL AND OPTICAL UNIT AND OPTOELECTRONIC DEVICE HAVING THE SAME

BACKGROUND OF THE INVENTION

1. Field of the Invention

The present invention relates to the technology field of optoelectronic devices, and more particularly to a halide material for application in the manufacture of an optoelectronic device.

2. Description of the Prior Art

In 1839, Gustav Rose, a Russian mineralogist, discovered a new mineral calcium titanium oxide ($CaTiO_3$), named perovskite. The general chemical formula for perovskite compounds is $ABX_3$, where A and B are two cations, often of very different sizes, and X is an anion (frequently oxide) that bonds to both cations. In recent years, organic-inorganic hybrid perovskites, such as methyl ammonium lead halide ($CH_3NH_3PbX_3$, $MAPbX_3$), are considered among the most promising photovoltaic materials owing to their peculiar optical and electrical properties and remarkable improvements in device performance.

Literature 1 has disclosed the fact that a low-temperature solution-processed optical film made of $MAPbX_3$ (X=Cl, Br, I) exhibits high optical gain, and can be used as a gain medium in a laser device. According to the disclosures of literature 1, it is understood that the ultra-stable amplified spontaneous emission of the optical film made of $MAPbX_3$ at strikingly low thresholds stems from its large absorption coefficients, ultralow bulk defect densities and slow Auger recombination. Therefore, straightforward visible spectral tunability (390-790 nm) is demonstrated. Importantly, in view of balanced ambipolar charge transport characteristics, the optoelectronic film made of $MAPbX_3$ may show electrically driven lasing. Herein, literature I is written by Xing et.al, and is entitled with "Low-temperature solution-processed wavelength-tunable perovskites for lasing" so as to be published on Nature Materials, vol. 13, pp. 476-480 (2014).

On the other hand, Literature II has disclosed that a perovskite light-emitting diode (PeLED) comprising a bottom electrode layer made of indium-tin oxide, a $TiO_2$ layer formed on the bottom electrode layer, a $CH_3NH_3PbI_{3-x}Cl_x$ layer formed on the $TiO_2$ layer, a poly(9,9'-dioctylfluorene) (i.e., F8) layer formed on the $CH_3NH_3PbI_{3-x}Cl_x$ layer, and a top electrode layer formed on the F8 layer. Herein, literature II is written by Tan et.al, and is entitled with "Bright light-emitting diodes based on organometal halide perovskite" so as to be published on Nature Nanotechnology, vol. 9, No. 9, pp. 687-692(2014). According to the disclosures of literature II, a thin (25 nm) layer of $TiO_2$ is deposited using atomic layer deposition (ALD) onto the $TiO_2$ layer, a thin (15 nm) layer of perovskite ($CH_3NH_3PbI_{3-x}Cl_x$) is deposited on the $TiO_2$ layer by spin coating, followed by annealing at 100° C., and the perovskite layer is capped with a 50 nm layer of F8 polymer by spin-coating from solution. By such design, the $TiO_2$ layer, the $CH_3NH_3PbI_{3-x}Cl_x$ layer and the F8 layer are constituted to a sandwich structure, such that the perovskite ($CH_3NH_3PbI_{3-x}Cl_x$) layer is placed between two large-bandgap semiconductors. Therefore, in case of bias voltage being applied to the PeLED, electrons and holes are effectively confined in the perovskite (i.e., $CH_3NH_3PbI_{3-x}Cl_x$) layer due to the sandwich structure of $TiO_2$, $CH_3NH_3PbI_{3-x}Cl_x$ and F8, thereby producing radiative recombination. As a result, disclosures of Literature II have indicated that, the perovskite material can be used as emission layer, and has a significant potential for application in optoelectronics industry.

From literatures I and II, it is also found that, wet process is often adopted for the fabrication of $MAPbX_3$ film, e.g., one-step spin coating process or two-step spin coating process. Although spin coating is widely used in producing uniform $MAPbX_3$ film, Literature III has particularly indicated that uncontrolled precipitation may be produced during using traditional spin coating method to fabricate a $MAPbX_3$ film Experimental data have showed that, the precipitation causes large morphological variations of the $MAPbX_3$ film, thereby hampering the prospects of the spin-coating-processed $MAPbX_3$ film for practical applications.

Herein, literature III is written by Burschka J et al., and is entitled with "Sequential Deposition as a Route to High-performance Perovskite-sensitized Solar Cells" so as to be published on Nature, Vol. 499, No. 7458, pp. 316-319 (2013). In the literature III, a sequential deposition method for the formation of the perovskite film is proposed. Firstly, $PbX_2$ is introduced from solution into a nanoporous $TiO_2$ film and subsequently transformed into the perovskite by exposing it to a solution of $CH_3NH_3X$. Experimental data have revealed that, the conversion occurs within the nanoporous host as soon as the two components come into contact, permitting much better control over the perovskite morphology than is possible with the previously employed route. In addition, experimental data have also revealed that, using this technique for the fabrication of solid-state mesoscopic solar cells greatly increases the reproducibility of their performance and allows us to achieve a power conversion efficiency of proximately 15 percent.

On the other hand, thermal evaporation can also be adopted for depositing a uniform and compact $MAPbX_3$ film on the $TiO_2$ layer. However, it is difficult to successfully achieve the fabrication of the $MAPbX_3$ film on a substrate or the $TiO_2$ layer by using thermal evaporation process due to the high temperature instability of the $CH_3NH_3X$ (i.e., MAX).

Material engineers skilled in organic synthesis should know that, polymer is a molecule of high molecular weight, and oligomer is a molecule that consists of a few monomer units. On the other hand, research reports have indicated that, oligomer semiconductors can be easily transformed to be a film by using thermal evaporation process because its sublimation temperature is lower than decomposition temperature.

In conclusion, $MAPbX_3$ is known an organic-inorganic hybrid perovskite that is made by taking methylammonium halide (MAX) and lead halide ($PbX_2$) as raw materials. Therefore, if there is an oligomer halide material developed for replacing the MAX, a brand-new organic-inorganic hybrid perovskite, having properties of uniformity and compactness, can be easily fabricated by taking the oligomer halide material and the lead halide ($PbX_2$, X=Cl, Br, I) as raw materials and using thermal evaporation process. Moreover, the organic-inorganic hybrid perovskite can be made to be an optoelectronic film so as to be applied in the manufacture of an optoelectronic device.

From above descriptions, it is understood that, there is a need to develop a suitable oligomer halide material for use in fabrication of an organic-inorganic hybrid perovskite. In view of that, inventors of the present application have made great efforts to make inventive research and eventually provided a halide material for application in the manufacture of the organic-inorganic hybrid perovskite and an optoelectronic device comprising an optoelectronic film made of the organic-inorganic hybrid perovskite.

SUMMARY OF THE INVENTION

The primary objective of the present invention is to disclose a halide material. The halide material is represented by a formula ArMAX, and can be processed to an optoelectronic film with a halogenated formamidine (FAX) and a lead halide, such that the optoelectronic film can be applied in the manufacture of an optoelectronic device like a perovskite laser or a PeLED. Experimental data have proved that, the fabricated optoelectronic film shows a property of photoluminescence (PL) peak wavelength adjustable. Moreover, the PL peak wavelength moves from 482 nm to 534 nm with the increase of the content of lead (Pb), halogen (X) and formamidine (FA) in the optoelectronic film. Furthermore, experimental data have also indicated that, the fabricated optoelectronic film can be used as a blue emissive layer, a red emissive layer or a green emissive layer, thereby having a significant potential for application in optoelectronics industry.

In order to achieve the primary objective of the present invention, inventors of the present invention provide an embodiment of the halide material, which has a general formula ArMAX, and is represented by following structural formula I:

wherein MA means methylamine, and Ar is selected from a group consisting of substituted or unsubstituted C6-C30 aryl group, substituted or unsubstituted C6-C30 aryloxy group, substituted or unsubstituted C6-C30 arylalkyl group, substituted or unsubstituted C6-C30 arylthio group, substituted or unsubstituted C5-C30 heteroaryl group, substituted or unsubstituted C5-C30 heteroaryloxy group, substituted or unsubstituted C5-C30 heteroarylthio group, and substituted or unsubstituted C5-C30 heteroarylalkyl group;

wherein m is a positive integer less than 10; and wherein X is a halogen selected from a group consisting of Cl, Br and I.

In one embodiment, the halide material has a molecular weight in a range between 300 and 800.

In one embodiment, the halide material is processed to a film included in an optoelectronic device, and the optoelectronic device is selected from a group consisting of perovskite laser and perovskite light-emitting diode (PeLED).

Moreover, the present invention also discloses an optoelectronic film, which is made of a halide material having a general formula ArMAX, a halogenated formamidine having a general formula FAX2, and a metal halide, and having a general formula $(ArMA)_2FA_{n-1}B_nX1_{3n+1}$;

wherein MA means methylamine, and Ar is selected from a group consisting of substituted or unsubstituted C6-C30 aryl group, substituted or unsubstituted C6-C30 aryloxy group, substituted or unsubstituted C6-C30 arylalkyl group, substituted or unsubstituted C6-C30 arylthio group, substituted or unsubstituted C5-C30 heteroaryl group, substituted or unsubstituted C5-C30 heteroaryloxy group, substituted or unsubstituted C5-C30 heteroarylthio group, and substituted or unsubstituted C5-C30 heteroarylalkyl group;

wherein B is a metal element selected from a group consisting of Pb, Sn, Ti, and Ge, X1 is a halogen selected from a group consisting of Cl, Br and I, and X2 being a halogen selected from a group consisting of Br and I; and wherein n is a positive integer in a range between 1 and 8.

In one embodiment, the halide material is represented by following structural formula I:

wherein m is a positive integer less than 10.

In one embodiment, the optoelectronic film is used as a gain medium layer included in a perovskite laser, or is used as an emission layer included in a perovskite light-emitting diode (PeLED).

Furthermore, the present invention also discloses an optoelectronic device, which particularly contains an optoelectronic film having a general formula $(ArMA)_2FA_{n-1}B_nX1_{3n+1}$;

wherein the optoelectronic film is made of a halide material having a general formula ArMAX, a halogenated formamidine having a general formula FAX2, and a metal halide;

wherein MA means methylamine, and Ar is selected from a group consisting of substituted or unsubstituted C6-C30 aryl group, substituted or unsubstituted C6-C30 aryloxy group, substituted or unsubstituted C6-C30 arylalkyl group, substituted or unsubstituted C6-C30 arylthio group, substituted or unsubstituted C5-C30 heteroaryl group, substituted or unsubstituted C5-C30 heteroaryloxy group, substituted or unsubstituted C5-C30 heteroarylthio group, and substituted or unsubstituted C5-C30 heteroarylalkyl group;

wherein B is a metal element selected from a group consisting of Pb, Sn, Ti, and Ge, X1 is a halogen selected from a group consisting of Cl, Br and I, and X2 being a halogen selected from a group consisting of Br and I; and wherein n is a positive integer in a range between 1 and 8.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a halide material for application in the manufacture of an optoelectronic device according to the present invention, embodiments of the present invention will be described in detail with reference to the attached drawings hereinafter.

The present invention discloses a halide material, which has a general formula ArMAX, and is represented by following structural formula I:

In the structural formula I, MA means methylamine, and Ar is selected from a group consisting of substituted or unsubstituted C6-C30 aryl group, substituted or unsubstituted C6-C30 aryloxy group, substituted or unsubstituted C6-C30 arylalkyl group, substituted or unsubstituted C6-C30 arylthio group, substituted or unsubstituted C5-C30 heteroaryl group, substituted or unsubstituted C5-C30 heteroaryloxy group, substituted or unsubstituted C5-C30 heteroarylthio group, and substituted or unsubstituted C5-C30 heteroarylalkyl group. For example, Ar is represented by following structural formula I-1:

In the structural formula I-1, each of $R_{11}$, $R_{12}$, $R_{13}$, $R_{14}$, $R_{15}$, and $R_{16}$ can optionally be hydrogen, alkyl group, alkenyl group, alkynyl group, alkoxy group, heterocycloalkyl group, cycloalkenyl group, or heterocycloalkenyl group. However, in case of considering to reduce the value of m as well as making the halide material have a specific molecular weight, each of $R_{11}$, $R_{12}$, $R_{13}$, $R_{14}$, $R_{15}$, and $R_{16}$ can also optionally be aryl group, aryloxy group, arylalkyl group, arylthio group, heteroaryl group, heteroaryloxy group, heteroarylthio group, or heteroarylalkyl group. According to the present invention, m is a positive integer less than 10, such that the halide material has a molecular weight in a range between 300 and 800. Moreover, X is a halogen selected from a group consisting of Cl, Br and I.

Manufacturing Method of the Halide Material

Figure 1:
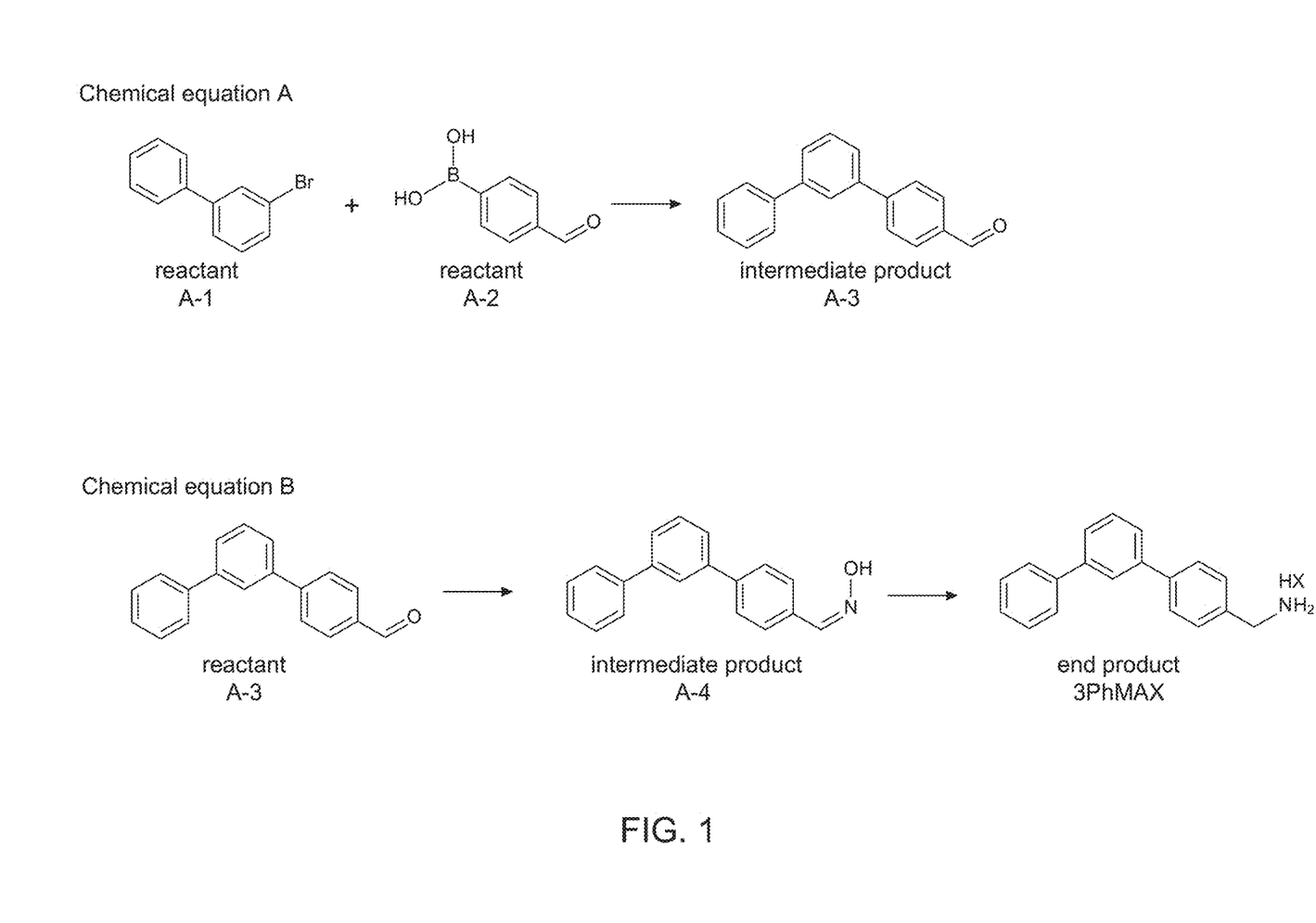
FIG. 1 shows a diagram for describing chemical reactions of a halide material according to the present invention.

For proving that the halide material represented by the forgoing structural formula I is indeed makeable, two manufacturing methods for the halide material are introduced thereinafter. FIG. 1 shows a diagram for describing chemical reactions when using a first manufacturing method to fabricate the halide material. As FIG. 1 shows, when making the halide material, 1.1 moles of 1-bromo-3-phenylbenzene (i.e., reactant A-1), 1.0 mole of 4-formylphenylboronic acid (i.e., reactant A-1), 4.0 moles of potassium carbonate ($K_2CO_3$), and 0.1 mole of tetrakis(triphenylphosphine)palladium ($Pd(PPh_3)_4$) are added into a round-bottomed flask. Next, 3-mL tetrahydrofuran (THF) and 3-mL water are further added into the round-bottomed flask. After being stirred, the solution accommodated in the round-bottomed flask is heated to 80 degrees Celsius, and is then kept at 80 degrees Celsius for 24 hours. Subsequently, the solution is cooled down to room temperature, and then dichloromethane and water are used to extract the solution, thereby collecting organic fraction. After that, magnesium sulfate anhydrous (MSDS) is used to achieve a dewatering process of the organic fraction, and then column chromatography machine and an eluent comprising ethyl acetate and n-hexane are adopted for purifying the dewatered organic fraction. As a result, creamy-white powder is obtained with up to 80% yield, where the creamy-white powder is [1,1':3',1''-terphenyl]-4-carbaldehyde (i.e., intermediate product A-3).

Subsequently, 1.0 mole of intermediate product A-3, 1.5 moles of hydroxylamine hydrochloride and 4.8 moles of NaOH are added into a round-bottomed flask, and then 4.5-mL ethanol and 0.96-mL water are added into the round-bottomed flask. After being stirred, the solution accommodated in the round-bottomed flask is heated to 120 degrees Celsius, and is then kept at 120 degrees Celsius for 10 minutes. Subsequently, the solution is cooled down to room temperature, and then is constantly stirred for 3 hours. After that, 100-mL HCl solution (1M) is added in to the round-bottomed flask, and then the solution accommodated in the round-bottomed flask is applied with a suction filtration process. As a result, a white powder is obtained with up to 87% yield, where the white powder is (Z)-[1,1':3',1''-terphenyl]-4-carbaldehyde oxime (i.e., intermediate product A-4).

Next, 1.0 mole of intermediate product A-4 and 14 moles of Zinc (Zn) are added into a round-bottomed flask, and then 5.4-mL acetic acid is added into the round-bottomed flask. After being stirred, the solution accommodated in the round-bottomed flask is kept at room temperature for 16 hours. Thereafter, the solution accommodated in the round-bottomed flask is applied with a suction filtration process. Next, after alkaline water is added in to the solution, dichloromethane and water are used to extract the solution, thereby collecting organic fraction. Subsequently, magnesium sulfate anhydrous (MSDS) is adopted for to achieving a dewatering process of the organic fraction, and then hydrogen halide (e.g., HI) solution is added into the solution, so as to make white powder be precipitated in the round-bottomed flask. The white powder is 3PhMAX (e.g., 3PhMAI).

As explained in more detail, full names of reactants, intermediate products and end product 3PhMAX in FIG. 1 are integrated in following Table (1).

TABLE (1)

| | Full name |
|---|---|
| A-1 | 1-bromo-3-phenylbenzene |
| A-2 | 4-Formylphenylboronic acid |
| A-3 | [1,1':3',1''-terphenyl]-4-carbaldehyde |
| A-4 | (Z)-[1,1':3',1''-terphenyl]-4-carbaldehyde oxime |
| 3PhMAX | [1,1':3',1''-terphenyl]-4-ylmethanammonium halide |

Figure 2A:
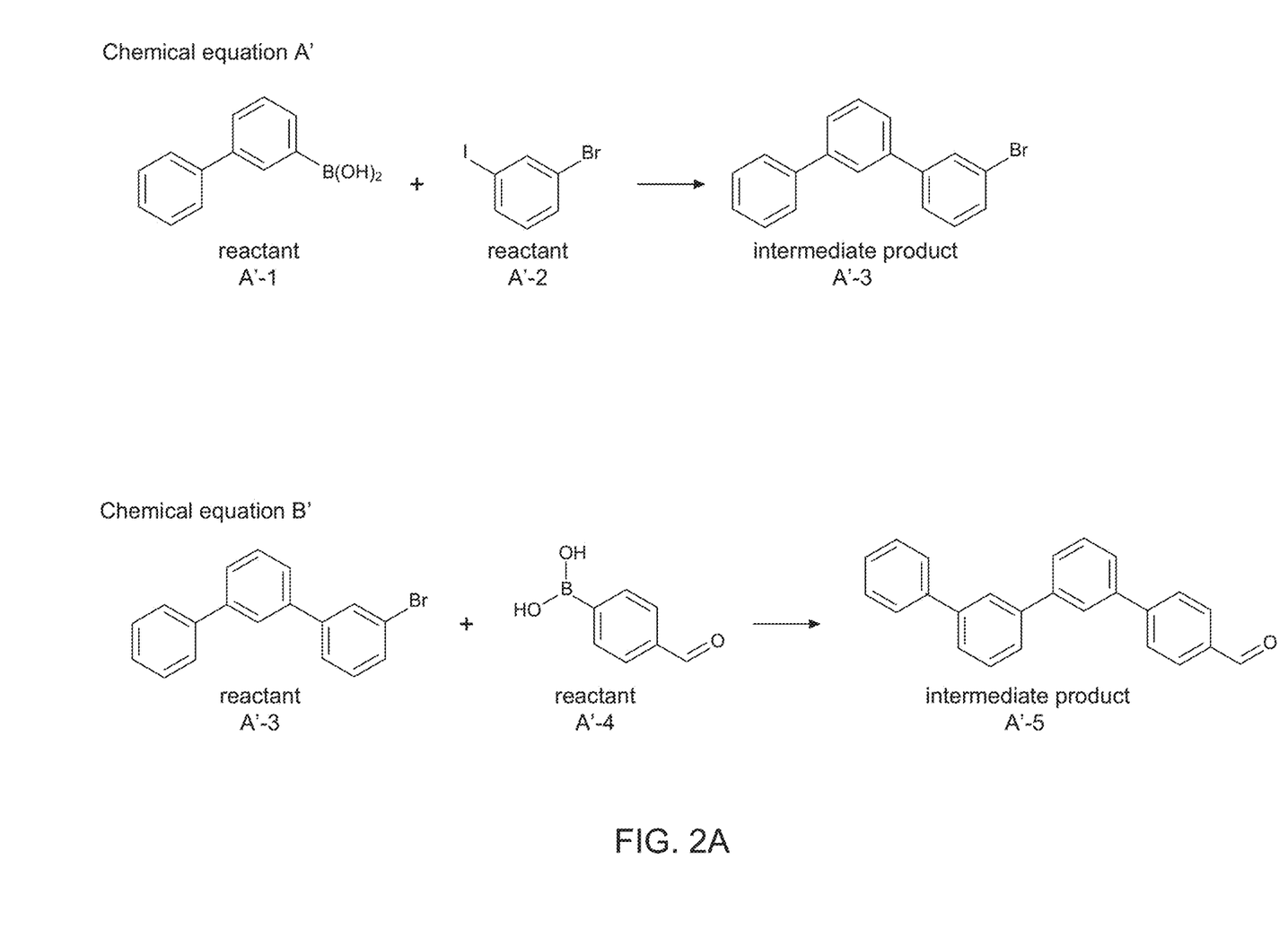
FIG. 2A and FIG. 2B show diagrams for describing chemical reactions of the halide material according to the present invention.
Figure 2B:
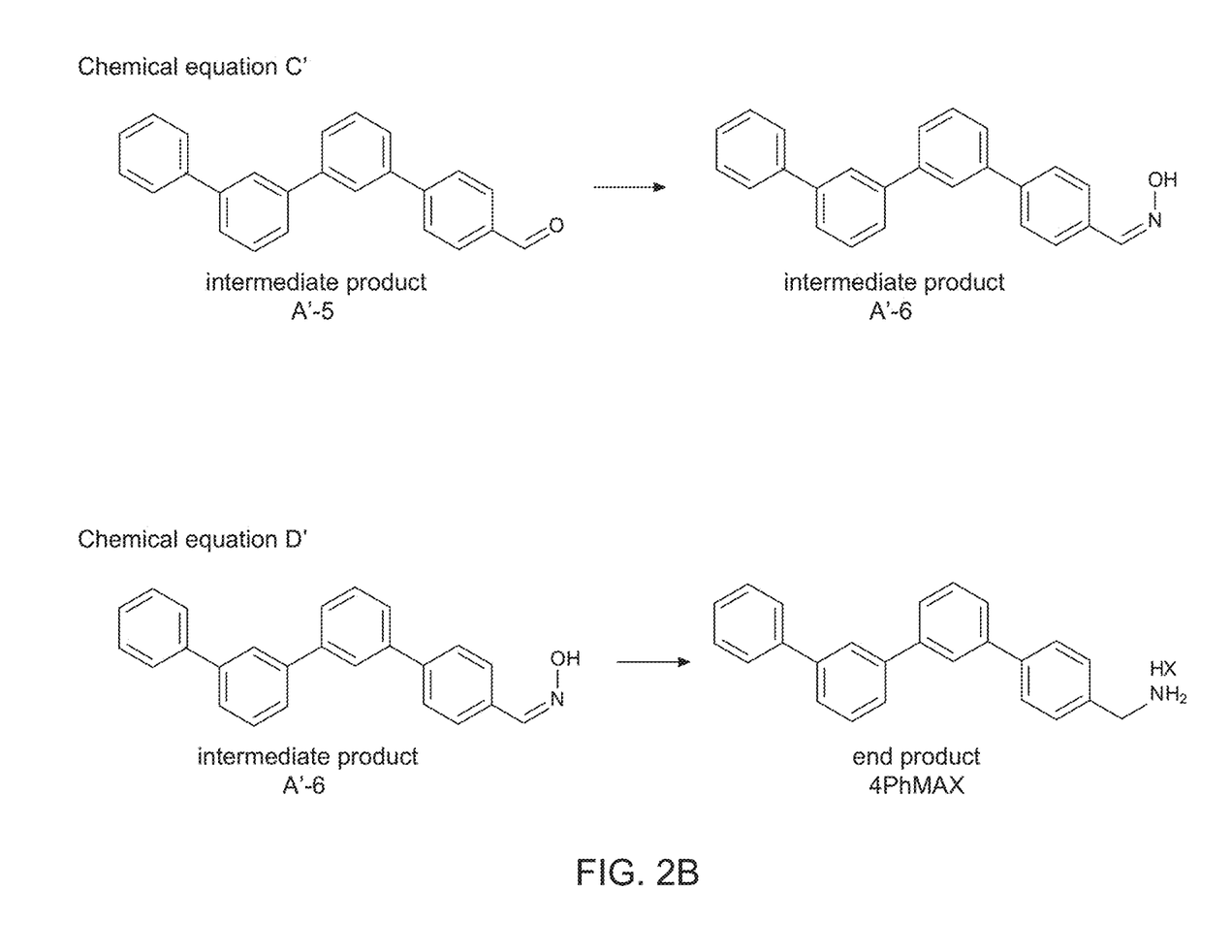

FIG. 2A and FIG. 2B are diagrams for describing chemical reactions when using a second manufacturing method to fabricate the halide material. As FIG. 2A shows, when making the halide material, 1.1 moles of 1-bromo-3-phenylbenzene (i.e., reactant A'-1), 1.0 mole of 1-bromo-3-iodobenzene (i.e., reactant A'-2), 4.0 moles of potassium carbonate ($K_2CO_3$), and 0.1 mole of tetrakis(triphenylphosphine)palladium ($Pd(PPh_3)_4$) are added into a round-bottomed flask. Next, 3-mL tetrahydrofuran (THF) and 3-mL water are further added into the round-bottomed flask. After being stirred, the solution accommodated in the round-bottomed flask is heated to 80 degrees Celsius, and is then kept at 80 degrees Celsius for 24 hours. Subsequently, the solution is cooled down to room temperature, and then dichloromethane and water are used to extract the solution, thereby collecting organic fraction. After that, magnesium sulfate anhydrous (MSDS) is used to achieve a dewatering process of the organic fraction, and then column chromatography machine and an eluent comprising ethyl acetate and n-hexane are adopted for purifying the dewatered organic fraction. As a result, creamy-white powder is obtained with up to 82% yield, where the creamy-white powder is [1,1':3',1''-terphenyl]-4-carbaldehyde (i.e., intermediate product A'-3).

Subsequently, 1.0 mole of intermediate product A'-3, 1.0 mole of 4-Formylphenylboronic acid (i.e., reactant A'-4), 4.0 moles of $K_2CO_3$, and 0.1 mole of $Pd(PPh_3)_4$ are added into a round-bottomed flask. Next, 3-mL THF and 3-mL water are further added into the round-bottomed flask. After being stirred, the solution accommodated in the round-bottomed flask is heated to 80 degrees Celsius, and is then kept at 80 degrees Celsius for 24 hours. Subsequently, the solution is cooled down to room temperature, and then dichloromethane and water are used to extract the solution, thereby collecting organic fraction. After that, magnesium sulfate anhydrous (MSDS) is used to achieve a dewatering process of the organic fraction, and then column chromatography machine and an eluent comprising ethyl acetate and n-hexane are adopted for purifying the dewatered organic fraction. As a result, creamy-white powder is obtained with up to 78% yield, where the creamy-white powder is [1,1':3',1'':3'''-quaterphenyl]-4-carbaldehyde (i.e., intermediate product A'-5).

Thereafter, as FIG. 2B shows, 1.0 mole of intermediate product A'-5, 1.5 moles of hydroxylamine hydrochloride and 4.8 moles of NaOH are added into a round-bottomed flask, and then 4.5-mL ethanol and 0.96-mL water are added into the round-bottomed flask. After being stirred, the solution accommodated in the round-bottomed flask is heated to 120 degrees Celsius, and is then kept at 120 degrees Celsius for 10 minutes. Subsequently, the solution is cooled down to room temperature, and then is constantly stirred for 3 hours. After that, 100-mL HCl solution (1M) is added in to the round-bottomed flask, and then the solution accommodated in the round-bottomed flask is applied with a suction filtration process. As a result, a white powder is obtained with up to 84% yield, where the white powder is (Z)-[1,1':3',1'':3'', 1'''-quaterphenyl]-4-carbaldehyde oxime (i.e., intermediate product A'-6).

Next, 1.0 mole of intermediate product A'-6 and 14 moles of Zn are added into a round-bottomed flask, and then 5.4-mL acetic acid is added into the round-bottomed flask. After being stirred, the solution accommodated in the round-bottomed flask is kept at room temperature for 16 hours. Thereafter, the solution accommodated in the round-bottomed flask is applied with a suction filtration process. Next, after alkaline water is added in to the solution, dichloromethane and water are used to extract the solution, thereby collecting organic fraction. Subsequently, magnesium sulfate anhydrous (MSDS) is adopted for to achieving a dewatering process of the organic fraction, and then hydrogen halide (i.e., HX) solution is added into the solution, so as to make white powder be precipitated in the round-bottomed flask. The white powder is 4PhMAX.

As explained in more detail, full names of reactants, intermediate products and end product 4PhMAX in FIG. 2A and FIG. 2B are integrated in following Table (2).

TABLE (2)

| | Full name |
|---|---|
| A'-1 | biphenyl-3-boronic acid |
| A'-2 | 1-bromo-3-iodobenzene |
| A'-3 | 3-bromo-1,1':3',1''-terphenyl |
| A'-4 | 4-Formylphenylboronic acid |
| A'-5 | [1,1':3',1'':3'',1'''-quaterphenyl]-4-carbaldehyde |
| A'-6 | (Z)-[1,1':3',1'':3'',1'''-quaterphenyl]-4-carbaldehyde oxime |
| 4PhMAX | [1,1':3',1'':3'',1'''-quaterphenyl]-4-ylmethanammonium halide |

Figure 3A:
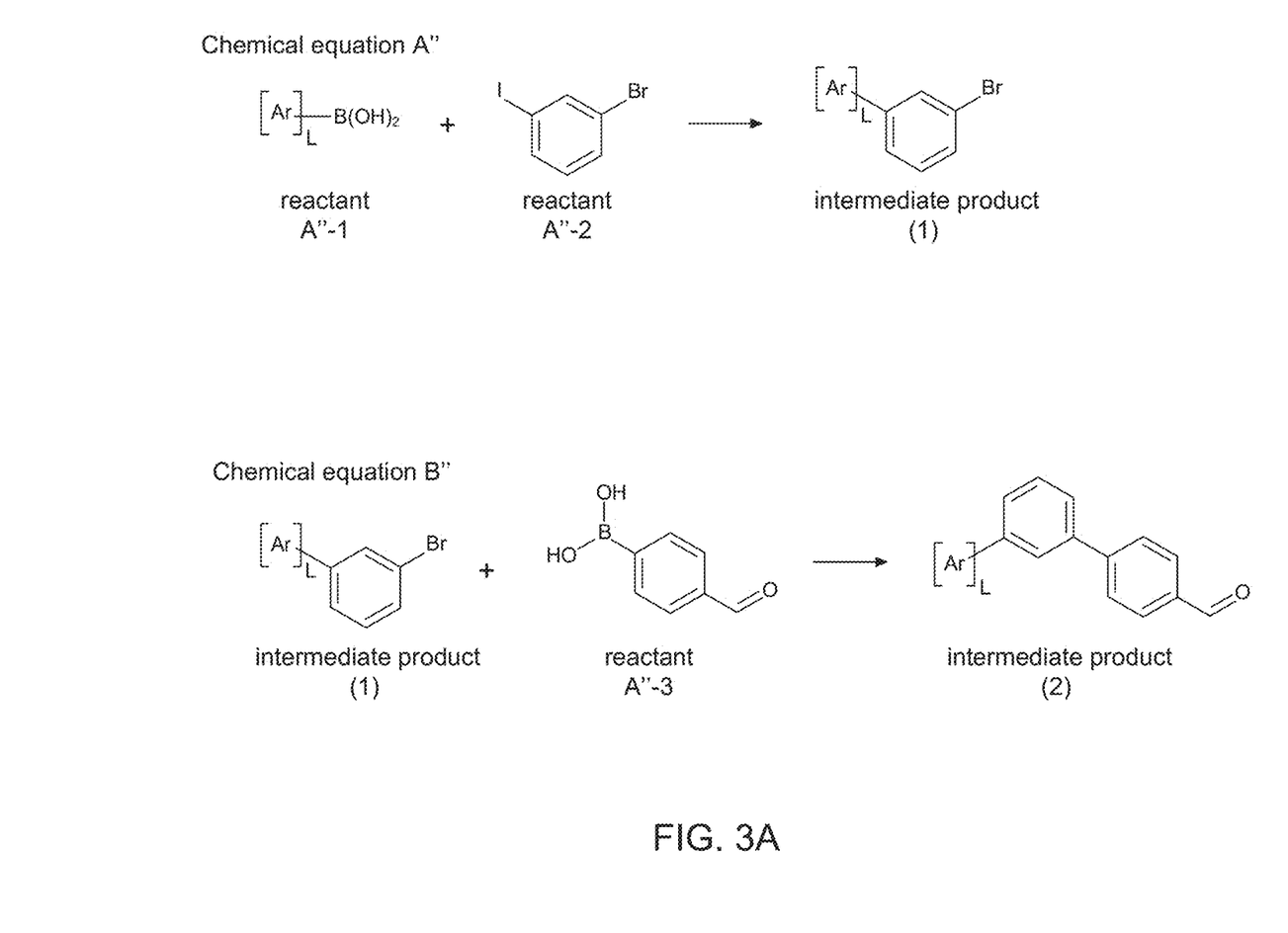
FIG. 3A and FIG. 3B show diagrams for describing chemical reactions of the halide material according to the present invention.
Figure 3B:
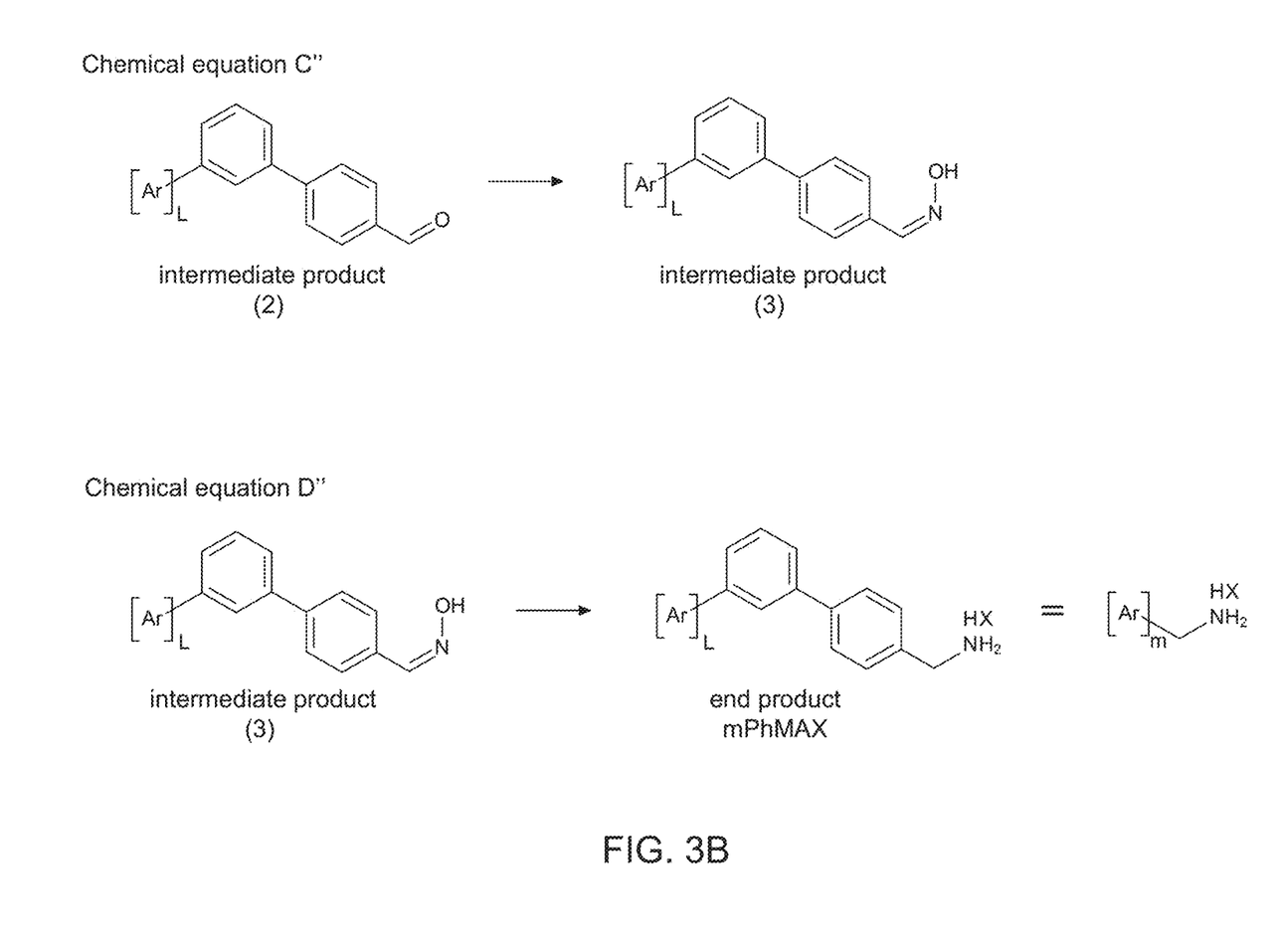

FIG. 3A and FIG. 3B are diagrams for describing chemical reactions for producing the halide material of the present invention. According to the chemical reactions shown in FIG. 1, FIG. 2A and FIG. 2B, it is understood that, organic boric acid is one of the starting materials for use in the synthesis of the halide material of the present invention, and the organic boric acid must contains at least one phenyl group. Moreover, the number of the phenyl group contained in the synthesized end product (i.e., the mPhMAX) is directly determined by the number of the phenyl group contained in the organic boric acid. Consequently, the organic boric acid is hence represented by following chemical structural formula I-2:

$[Ar]_{\overline{L}} - B(OH)_2.$

In the chemical structural formula I-2, Ar can be phenyl group, aryl group, aryloxy group, arylalkyl group, arylthio group, heteroaryl group, heteroaryloxy group, heteroarylthio group, or heteroarylalkyl group. Material engineers skilled in organic synthesis certainly know that the most basic aryl group is phenyl, and the notation of phenyl is "Ph". Moreover, from FIG. 1, FIG. 2A and FIG. 2B, it is extrapolated that L is an integer equal to or greater than 1.

In FIG. 3A, an intermediate product (1) is synthesized by taking the organic boric acid that is represented by the forgoing chemical structural formula I-2 and 1-bromo-3-iodobenzene as two reactants A''-1 and A''-2. Next, the intermediate product (1) is processed to an intermediate product (2) through chemical reactions. Eventually, in FIG. 3B, the intermediate product (2) is further processed to an end product mPhMAX (i.e., the halide material of the present invention).

There are some exemplary embodiments for the halide material according to the present invention, and the exemplary embodiments are respectively represented by following chemical structural formulae (1)-(8):

chemical structural formula (1)

2PhMAX chemical structural formula (2)

3PhMAX chemical structural formula (3)

4PhMAX chemical structural formula (4)

5PhMAX chemical structural formula (5)

6PhMAX chemical structural formula (6)

7PhMAX chemical structural formula (7)

8PhMAX chemical structural formula (8)

9PhMAX

To describe the halide material repeatedly. According to present invention, the halide material has a general formula ArMAX, has a molecular weight in a range between 300 and 800, and is represented by the forgoing chemical structural formula I. In other words, the above-presented chemical structural formulae (1)-(8) are the exemplary embodiments of forgoing chemical structural formula I.

Photoelectric Unit Comprising the Halide Material

The present invention simultaneously discloses an optoelectronic film, which is made of a halide material having a general formula ArMAX, a halogenated formamidine having a general formula FAX2, and a metal halide, and has a general formula $(ArMA)_2FA_{n-1}B_nX1_{3n+1}$. In one embodiment, the optoelectronic film of the present invention can be included in a perovskite laser for being used as a gain medium layer. In another one embodiment, the optoelectronic film of the present invention can also be included in a perovskite light-emitting diode (PeLED) for being used as an emission layer.

Figure 4:
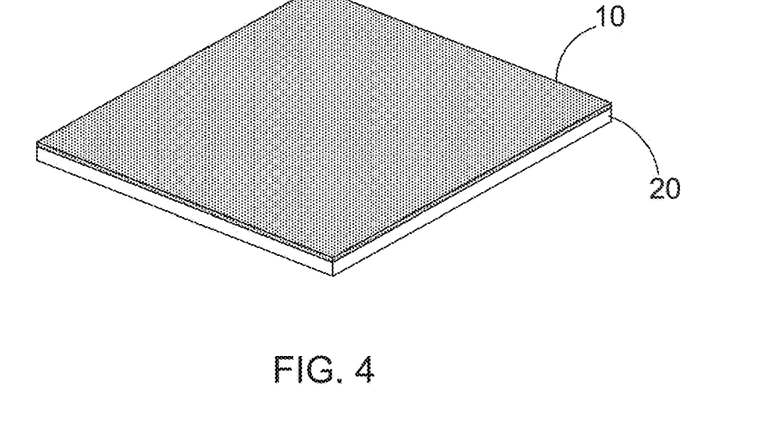
FIG. 4 shows a schematic stereo diagram of an optoelectronic unit according to the present invention.

FIG. 4 shows a schematic stereo diagram of the photoelectric unit. As FIG. 4 shows, the photoelectric unit comprises a substrate 20 and an optoelectronic film 10 formed on the substrate 20. In one embodiment, the optoelectronic film 10 is made by taking the halide material (ArMAX) of the present invention, a halogenated formamidine (FAX2) material and a metal halide (BX1) material as raw materials as well as using thermal evaporation equipment. As a result, the optoelectronic film 10 has a general formula $(ArMA)_2FA_{n-1}B_nX1_{3n+1}$. According to the present invention, n is a positive integer in a range between 1 and 8, B is a metal element selected from a group consisting of Pb, Sn, Ti, and Ge, X1 is a halogen selected from a group consisting of Cl, Br and I, and X2 is a halogen selected from a group consisting of Br and I. Moreover, because the number of the phenyl group contained in the synthesized mPhMAX (i.e., the Halide material) is directly determined by the number of the phenyl group contained in the organic boric acid. Ar in the general formula ArMAX (Ar=mPh) is selected from a group consisting of substituted or unsubstituted C6-C30 aryl group, substituted or unsubstituted C6-C30 aryloxy group, substituted or unsubstituted C6-C30 arylalkyl group, substituted or unsubstituted C6-C30 arylthio group, substituted or unsubstituted C5-C30 heteroaryl group, substituted or unsubstituted C5-C30 heteroaryloxy group, substituted or unsubstituted C5-C30 heteroarylthio group, and substituted or unsubstituted C5-C30 heteroarylalkyl group.

Experiments

For proving that the optoelectronic film 10 of the present invention has a significant potential in application of the manufacture of photoelectric devices, experiment I is firstly competed. In experiment I, an optoelectronic film 10 made of 4PhMAI and $PbI_2$ is formed on a substrate 20. Herein, it is found that the raw materials for making the optoelectronic film 10 in experiment I does not include halogenated formamidine (FAX2). Eventually, there are five samples of the optoelectronic film 10 fabricated in experiment I, and the basic information of the five samples are provided in following Table (3).

TABLE 3

| Sample No. | General formula |
| --- | --- |
| 1 (n = 1) | $(4PhMA)_2PbI_4$ |
| 2 (n = 2) | $(4PhMA)_2Pb_2I_7$ |
| 3 (n = 3) | $(4PhMA)_2Pb_3I_{10}$ |
| 4 (n = 4) | $(4PhMA)_2Pb_4I_{13}$ |
| 5 (n = 5) | $(4PhMA)_2Pb_5I_{16}$ |

Figure 5:
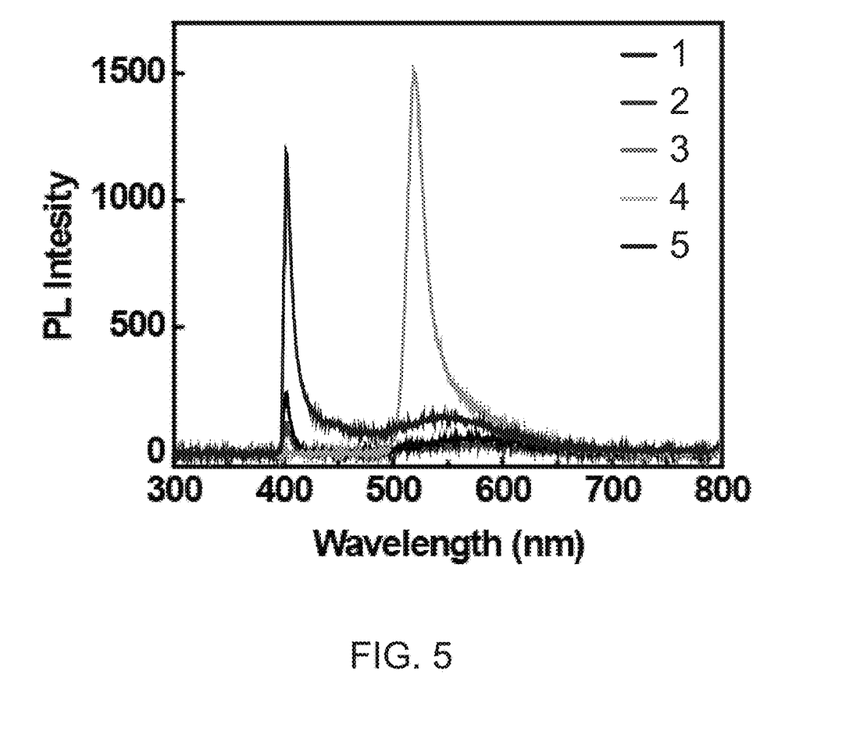
FIG. 5 shows a diagram containing photoluminescence (PL) spectra of five samples of the optoelectronic unit.

FIG. 5 shows a diagram containing photoluminescence (PL) spectra of five samples of the optoelectronic unit. From FIG. 5, it is clear that sample No. 1, 2, 3, 4, and 5 have PL peak wavelength at 402 nm, 402 nm, 520 nm, 504 nm, and 402 nm, respectively. Therefore, experimental data of FIG. 5 have proved that, PL peak wavelength of the optoelectronic film 10 of the present invention not forward or backward shifts with the increase of n.

Moreover, for proving that the optoelectronic film 10 of the present invention has a significant potential in application of the manufacture of photoelectric devices, experiment II is also competed. In experiment I, an optoelectronic film 10 made of 4PhMAX (X=Br), FAX (X=Br) and $PbBr_2$ is formed on a substrate 20. Herein, it is understood that optoelectronic film 10 formed on the substrate 20 has a general formula $(4PhMA)_2FA_{n-1}Pb_nBr_{3n+1}$. Eventually, there are four samples of the optoelectronic film 10 fabricated in experiment II, and the basic information of the four samples are provided in following Table (4).

TABLE (4)

| Sample No. | General formula |
| --- | --- |
| 6 (n = 2) | $(4PhMA)_2FAPb_2Br_7$ |
| 7 (n = 3) | $(4PhMA)_2FA_2Pb_3Br_{10}$ |
| 8 (n = 4) | $(4PhMA)_2FA_3Pb_4Br_{13}$ |
| 9 (n = 5) | $(4PhMA)_2FA_4Pb_5Br_{16}$ |

Figure 6:
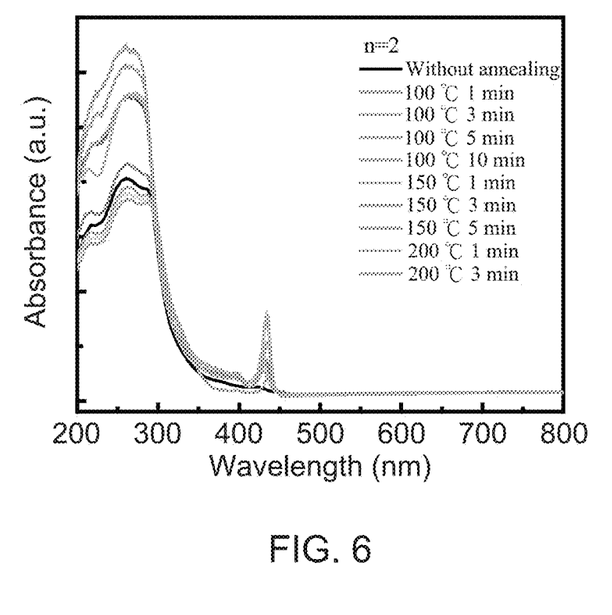
FIG. 6 shows a diagram containing absorption spectrum of sample No. 6 of the optoelectronic unit.
Figure 7:
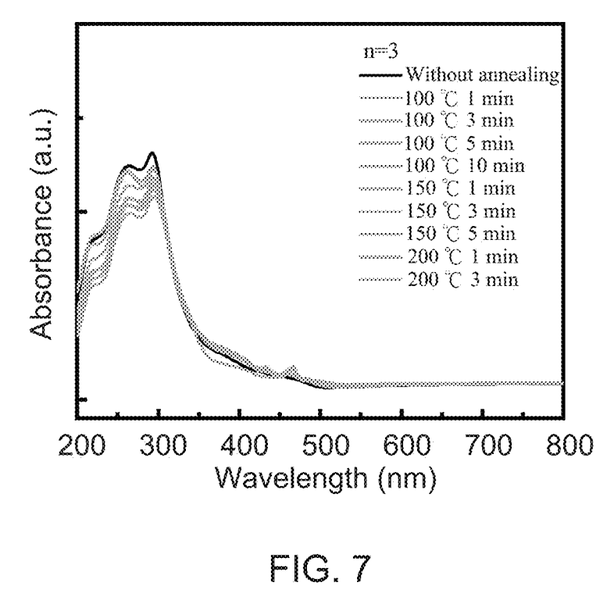
FIG. 7 shows a diagram containing absorption spectrum of sample No. 7 of the optoelectronic unit.
Figure 8:
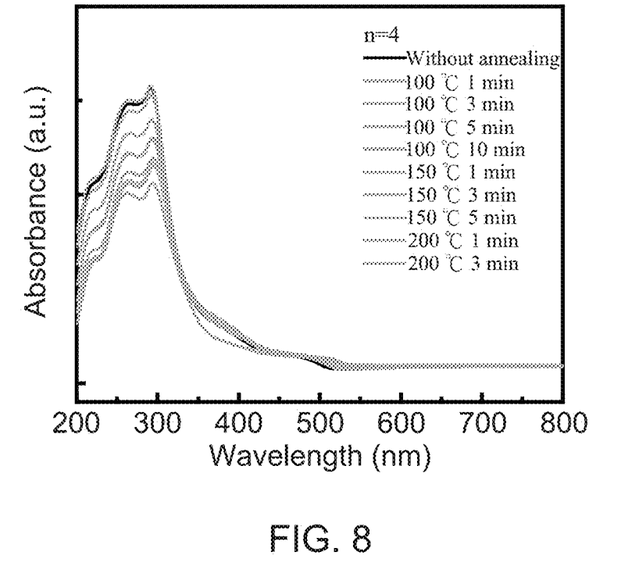
FIG. 8 shows a diagram containing absorption spectrum of sample No. 8 of the optoelectronic unit.
Figure 9:
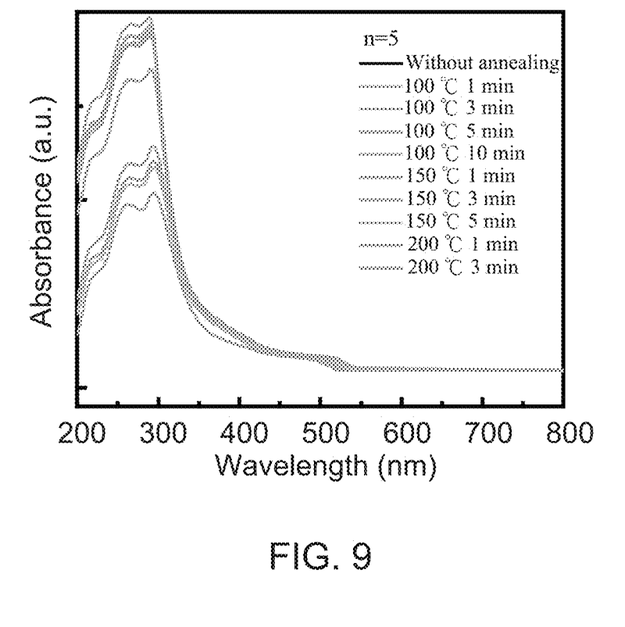
FIG. 9 shows a diagram containing absorption spectrum of sample No. 9 of the optoelectronic unit.
Figure 10:
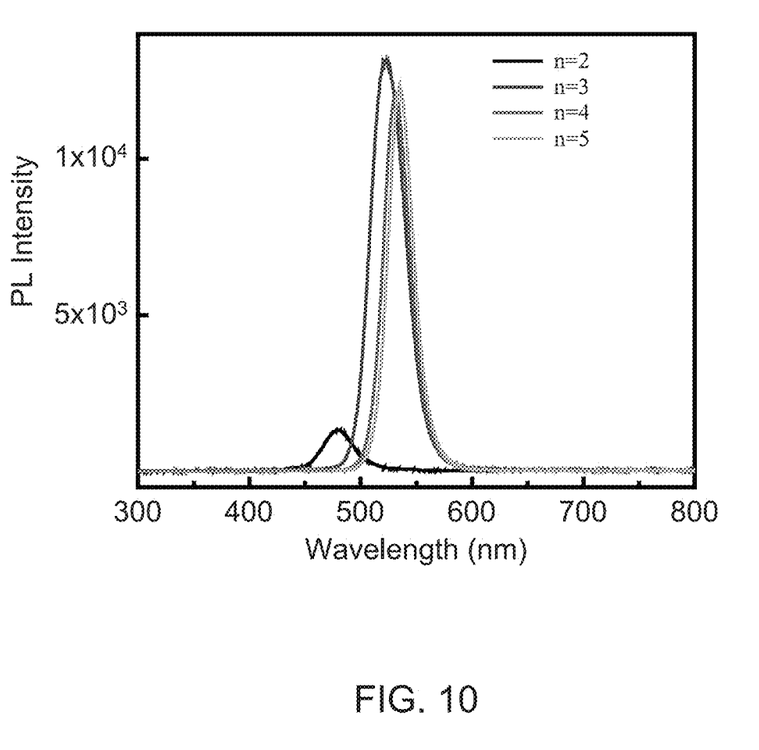
FIG. 10 shows a diagram containing PL spectra of four samples of the optoelectronic unit.

FIG. 6 is a diagram containing absorption spectrum of sample No. 6 of the optoelectronic unit, FIG. 7 is a diagram containing absorption spectrum of sample No. 7 of the optoelectronic unit, FIG. 8 is a diagram containing absorption spectrum of sample No. 8 of the optoelectronic unit, and FIG. 9 is a diagram containing absorption spectrum of sample No. 9 of the optoelectronic unit. From FIG. 6, it is observed that the sample No. 6 of the optoelectronic film 10 exhibits a maximum absorption at wavelength of 260 nm. On the other hand, range of the maximum absorption wavelength of the samples No. 7, No. 8 and No. 9 is between 296 nm and 298 nm. In addition, FIG. 10 shows a diagram containing PL spectra of the four samples of the optoelectronic film. Moreover, related experimental data of the four samples of the optoelectronic film 10 are integrated in following Table (5A) and Table (5B).

TABLE (5A)

|  | Sample No. 6 | Sample No. 7 |
| --- | --- | --- |
| PL peak wavelength | 482 nm | 522 nm |
| FWHM | 30 nm | 34 nm |
| PLQY | 3.13% | 9.03% |

TABLE (5B)

|  | Sample No. 8 | Sample No. 9 |
| --- | --- | --- |
| PL peak wavelength | 530 nm | 534 nm |
| FWHM | 26 nm | 27 nm |
| PLQY | 39.6% | 40.14% |

From the experimental data of Table (2A) and Table (2B), it is clear that sample No. 6, 7, 8, and 9 have PL peak wavelength at 482 nm, 522 nm, 530 nm, and 434 nm, respectively. Therefore, experimental data have proved that, PL peak wavelength of the optoelectronic film 10 of the present invention not forward or backward shifts with the increase of n. Moreover, experimental data have also indicated that, the optoelectronic film 10 of the present invention can be used as a blue emissive layer, a red emissive layer or a green emissive layer, thereby having a significant potential for application in optoelectronics industry.

Therefore, through above descriptions, all embodiments and their constituting elements of the halide material for application in the manufacture of an optoelectronic device according to the present invention have been introduced completely and clearly. The above description is made on embodiments of the present invention. However, the embodiments are not intended to limit scope of the present invention, and all equivalent implementations or alterations within the spirit of the present invention still fall within the scope of the present invention.

What is claimed is:

1. A halide material for making an optoelectronic film, having a general formula ArMAX, and being represented by following chemical formula:

wherein X is a halogen selected from a group consisting of Cl, Br and I.

2. An optoelectronic fila, being manufactured by using a halide material as one raw material thereof, characterized in that the halide material has a chemical structure represented as follows:

wherein X is a halogen selected from a group consisting of Cl, Br and I.

3. The optoelectronic film of claim 2, wherein the optoelectronic film is included in an optoelectronic device selected from a group consisting of perovskite laser and perovskite light-emitting diode (PeLED).

4. The optoelectronic film of claim 2, wherein the optoelectronic film is a gain medium layer included in a perovskite laser.

5. The optoelectronic film of claim 2, wherein the optoelectronic film is an emission layer included in a perovskite light-emitting diode (PeLED).

6. An optoelectronic device, characterized in that containing an optoelectronic film made of a halide material, a halogenated formamidine, and a metal halide, wherein the halide material has a chemical structure represented as follows:

wherein X is a halogen selected from a group consisting of Cl, Br and I.

7. The optoelectronic device of claim 6, wherein the optoelectronic device is a perovskite laser, and the optoelectronic film being a gain medium layer included in the perovskite laser.

8. The optoelectronic device of claim 6, wherein optoelectronic device is a perovskite light-emitting diode (PeLED), and the optoelectronic film being an emission layer included in the PeLED.

* * * * *